US011171678B2

(12) United States Patent
Hoang et al.

(10) Patent No.: US 11,171,678 B2
(45) Date of Patent: Nov. 9, 2021

(54) TWO-PORT MIXERS AND SYSTEMS, RECEIVERS, AND METHODS USING SAME

(71) Applicant: University of Washington, Seattle, WA (US)

(72) Inventors: Alexander Tung Hoang, Seattle, WA (US); Joshua F. Ensworth, Seattle, WA (US); Matthew S. Reynolds, Seattle, WA (US)

(73) Assignee: University of Washington, Seattle, WA (US)

( * ) Notice: Subject to any disclaimer, the term of this patent is extended or adjusted under 35 U.S.C. 154(b) by 306 days.

(21) Appl. No.: 16/088,405

(22) PCT Filed: Mar. 29, 2017

(86) PCT No.: PCT/US2017/024726
§ 371 (c)(1),
(2) Date: Sep. 25, 2018

(87) PCT Pub. No.: WO2017/172899
PCT Pub. Date: Oct. 5, 2017

(65) Prior Publication Data
US 2020/0304160 A1    Sep. 24, 2020

Related U.S. Application Data

(60) Provisional application No. 62/314,724, filed on Mar. 29, 2016.

(51) Int. Cl.
*H04B 1/16*      (2006.01)
*H03D 7/12*      (2006.01)
(Continued)

(52) U.S. Cl.
CPC .............. *H04B 1/16* (2013.01); *H03D 7/125* (2013.01); *H03H 7/38* (2013.01); *H04B 1/04* (2013.01); *H04B 2001/0491* (2013.01)

(58) Field of Classification Search
CPC ... H04B 1/04; H04B 1/16; H04B 1/18; H04B 1/48; H04B 2001/0491; H04B 7/15; (Continued)

(56) References Cited

U.S. PATENT DOCUMENTS 5,802,463 A    9/1998 Zuckerman
6,295,461 B1   9/2001 Palmer et al.
(Continued)

OTHER PUBLICATIONS

"International Search Report and Written Opinion dated Jun. 27, 2017 for PCT Application No. PCT/US2017/024726".
(Continued)

*Primary Examiner* — Ankur Jain
(74) *Attorney, Agent, or Firm* — Dorsey & Whitney LLP

(57) ABSTRACT

Examples of receivers and receiver techniques are described herein. An example system may include a carrier source that may provide a wireless carrier signal and a wireless communication device, separate from the carrier source. The wireless communication device may provide a wireless communication signal containing data. A receiver may include an antenna positioned to receive the wireless carrier signal and the wireless communication signal, a two-port mixer coupled to the antenna and configured to mix the wireless carrier signal and the wireless communication signal to provide an intermediate frequency signal, and a demodulator configured to extract, at least in part, the data from the intermediate frequency signal.

20 Claims, 10 Drawing Sheets

(51) Int. Cl.
*H03H 7/38* (2006.01)
*H04B 1/04* (2006.01)

(58) Field of Classification Search
CPC .......... H02J 50/10; H02J 50/80; H03D 7/125; H03H 7/38
See application file for complete search history.

(56) References Cited

U.S. PATENT DOCUMENTS

| | | | |
|---|---|---|---|
| 6,738,414 B2 | 5/2004 | Emery et al. | |
| 6,826,234 B1 | 11/2004 | Shoji et al. | |
| 7,499,684 B2 | 3/2009 | Cavin | |
| 8,885,773 B2 | 11/2014 | Cha et al. | |
| 9,014,310 B2 | 4/2015 | Park et al. | |
| 2002/0102957 A1 | 8/2002 | Tseng et al. | |
| 2004/0192223 A1 | 9/2004 | Gardenfors et al. | |
| 2007/0014337 A1 | 1/2007 | Kim et al. | |
| 2007/0247314 A1 | 10/2007 | Barink et al. | |
| 2008/0051038 A1 | 2/2008 | Hindson et al. | |
| 2009/0110035 A1 | 4/2009 | Sutton et al. | |
| 2010/0210272 A1 | 8/2010 | Sundstrom et al. | |
| 2011/0248825 A1* | 10/2011 | Hamel | H04Q 9/00 340/10.1 |
| 2011/0309686 A1* | 12/2011 | Scherbenski | H02J 50/10 307/104 |
| 2012/0286935 A1* | 11/2012 | Huang | G01N 29/14 340/10.1 |
| 2013/0127605 A1 | 5/2013 | Beasley et al. | |
| 2014/0113561 A1 | 4/2014 | Maguire | |
| 2018/0085593 A1* | 3/2018 | Fayram | H02J 50/80 |
| 2018/0254715 A1* | 9/2018 | Rangel | H02M 7/06 |

OTHER PUBLICATIONS

Molnar, et al., Molnar et al., "An ultra-low power 900 MHz RF transceiver for wireless sensor networks", Custom Integrated Circuits Conference, IEEE (Sep. 2014) p. 401-404.

Wong, at al., Wong et al., "A 1 V Wireless Transceiver for an Ultra-Low Power SoC for Biotelemetry Applications", Solid-State Circuits, IEEE Journal of (Jul. 2008) p. 1511-1521.

* cited by examiner

TWO-PORT MIXERS AND SYSTEMS, RECEIVERS, AND METHODS USING SAME

CROSS-REFERENCE TO RELATED APPLICATION(S)

This application is a 35 U.S.C. § 371 National Stage Application of PCT Application No. PCT/US2017/024726, filed Mar. 29, 2017, which claims the benefit under 35 § 119 of the earlier filing date of U.S. Provisional Application Ser. No. 62/314,724, filed Mar. 29, 2016. The entire contents of the aforementioned applications are hereby incorporated by reference, in their entirety, and for any purposes.

TECHNICAL FIELD

Examples described herein relate generally to wireless receivers. Examples of receivers including two-port mixers are described.

BACKGROUND

Commonly used conventional wireless receivers for mobile devices may generally broadly fall into four architectural categories: envelope detection, regenerative and super-regenerative receivers, homodyne receivers (also called zero-IF receivers), and superheterodyne receivers.

The first, and simplest, of these categories is envelope detection. Envelope detection generally consists of extracting the signal envelope, for example by using a rectifying element such as one or more diodes, or one or more transistors operating in a non-linear mode, to track the peak amplitude of the incoming signal. Envelope detectors are generally only sensitive to the signal amplitude and not the signal frequency nor the signal phase. Envelope detection is thus generally only suitable for receiving amplitude modulated signals such as ASK (amplitude shift keying), PAM (pulse amplitude modulation) or OOK (on-off keying). Because envelope detectors can be implemented with a single diode, as in the case of the well-known crystal radio, they have low power and low complexity and can be easily integrated onto a single integrated circuit with other circuitry, including digital logic. For this reason, envelope detectors are commonly used in low power applications such as battery-free radio frequency identification (RFID) transponders or tags.

In addition to the aforementioned limitation in the type of signals that can be received by an envelope detector, a second important disadvantage of the envelope detector is a lack of frequency selectivity. In receivers using simple envelope detectors, such as RFID tags, the envelope detector will generally respond to the total energy within the bandwidth of the antenna and its impedance matching circuitry. Thus, envelope detectors generally have poor immunity to interference from nearby devices. It is possible to add a narrow-band RF bandpass filter operating at the signal frequency (such as 915 MHz, 2.4 GHz, 5.8 GHz, etc.) to the envelope detector to improve its rejection of unwanted signals, forming a so-called tuned radio frequency (TRF) receiver. In a TRF receiver, channel selectivity is performed by one or more RF filters that have a passband including the desired signal frequency. TRF receivers may also optionally have tuned RF amplification stages.

However, the RF bandpass filters used in TRF receivers often have significant disadvantages such as difficulty of integration in standard integrated circuit processes (e.g. CMOS processes), difficulty in maintaining alignment among multiple tuned amplification or detection stages, filter center frequency changes with component drift, process variation and temperature (PVT variation), and insertion loss that reduces the sensitivity of the envelope detector. Thus, envelope detectors and TRF receivers are normally considered to be suitable only for low-cost, low-performance wireless devices, such as RFID tags.

A second category of conventional receiver topologies comprises regenerative and super regenerative receivers. Such receivers employ self-oscillation in a resonant circuit including the detector's active device (such as a transistor) to detect amplitude or frequency modulated signals. When a signal is present at or near the frequency of the self-oscillation, the device's oscillation parameters, such as the voltage at one terminal of the active device, or the current drawn by the active device, change in rough proportion to the amplitude and/or frequency of the input signal. Because such self-oscillating detectors are most sensitive at the onset of oscillation, they generally require critical adjustment to the active device's bias current and/or the amount of feedback to maintain an operating point at the onset of oscillation. Such detectors are very sensitive to PVT and component variation and they are therefore usually hand adjusted at the time of manufacture which is a costly and unreliable process. Furthermore, the bandwidth of the signals that can be demodulated is limited to the bandwidth of the resonant circuit including the detector's active device. If the resonant circuit has a high quality factor, or Q factor, leading to a more sensitive receiver, the achievable signal detection bandwidth will be decreased. If on the other hand the resonant circuit has a low quality factor, the signal bandwidth will be increased, but the receiver will have less rejection of unwanted signals.

Because of the aforementioned tradeoffs with the Q factor of the resonant circuit, and the difficulty in maintaining an appropriate operating point for the active device(s) near the threshold of operation, regenerative and super-regenerative receivers are generally not generally suitable for high data rate applications. Typically these receivers are not useful at data rates above approximately 10-100 kilobits per second (kbps).

A third category of receivers is the homodyne, or zero-IF receiver. Homodyne receivers are often built using a single chip implementation containing a local oscillator (LO) and a frequency translating mixer to downconvert an incoming band-pass RF signal from the signal's original carrier frequency to baseband. The baseband signal is then processed using a demodulator such as a coherent or incoherent demodulator to recover either the in-phase component of the baseband signal, the quadrature component of the baseband signal, or both (I/Q demodulation). One advantage of the homodyne receiver is that acceptable frequency selectivity can more easily be obtained by filtering the baseband signal with a low-pass filter with cutoff frequency appropriate for the modulation bandwidth, rather than filtering the incoming RF signal with a band-pass filter centered on the signal's center frequency. Thus, channel selectivity in the homodyne receiver is performed by baseband filtering. To tune the homodyne receiver to a new channel, the receiver's LO frequency is simply changed to the center of a new channel pass band.

While commonly used, the homodyne receiver may have some significant disadvantages that can be problematic in practice, including limitations in the second-order nonlinear performance of the frequency translating mixer. If the frequency translating mixer has a significant second-order nonlinearity, any amplitude variation in the mixer's input signal will be converted to an unwanted signal in baseband. For example, if a homodyne receiver is designed to receive a weak signal in a particular frequency range by downconverting that frequency range to baseband, but a strong interferer is present, any amplitude variation in the interferer will also appear in the baseband spectrum and cannot be easily separated from the desired downconversion product.

A second limitation of the homodyne receiver topology may be the increased 1/f noise and the DC offset generated by active devices. The 1/f noise also appears in the baseband spectrum in combination with the desired signal component. Most active devices have significant noise near DC and this noise reduces the signal-to-noise ratio of the desired signal product. The unwanted DC offset of the frequency mixer and subsequent amplifiers can be problematic unless an active servo loop is used to adjust the bias of the mixer and amplifiers to trim out the dc offset, thus leading to increased complexity and power consumption.

A third limitation of the homodyne receiver topology is the need for a local oscillator (LO) needed as an input to the frequency translating mixer. This local oscillator must generally be slightly offset from the desired input signal range such that the difference between the input frequency band and the LO frequency will occupy the baseband. In many receiver applications, generating a stable local oscillator signal is among the most power intensive functions of the receiver circuitry. This is due to the need for frequency stability of the LO, the need for the lowest achievable phase noise from the LO, and often the need for significant LO power to drive the frequency mixer. Often the LO is generated with a phase locked loop (PLL) frequency synthesizer circuit. In a typical frequency synthesizer, a voltage controlled oscillator (VCO) is provided which can be tuned through a range including the desired LO frequency. Digital frequency divider circuitry divides the VCO's frequency by some integer or rational fraction to form a lower frequency comparison signal. This lower frequency signal is then compared in frequency and phase to a reference oscillator, often provided by a quartz crystal. The difference in frequency and/or phase between the reference oscillator and the comparison signal is then filtered and used in a feedback system to adjust the control voltage of the VCO to achieve phase lock between the reference oscillator and the comparison signal. Because the comparison signal has a known division ratio with respect to the desired LO frequency, and the comparison signal is driven to a known frequency and phase with respect to the reference oscillator, the PLL synthesizer allows the VCO signal (and thus the LO signal) to have comparable frequency accuracy and frequency stability to the reference oscillator.

The problem with this commonly used PLL local oscillator generation strategy is that it contains several power-hungry subsystems, including the VCO itself, the digital frequency divider, and the reference oscillator. As the signal frequency increases, the digital frequency divider circuitry consumes increasing power. For example, in standard CMOS technology, the power consumption of digital logic scales as $0.5*C*V^2*f$ where C is the effective gate capacitance, V is the power supply voltage, and f is the switching frequency of the digital logic. It is often the case that the digital frequency divider block is one of the dominant consumers of power in the receiver. Thus the LO generation function is often a dominant part of a homodyne or zero-IF receiver's power consumption.

A fourth category of wireless receivers that is commonly used is the superheterodyne receiver. A superheterodyne receiver is conceptually similar to a homodyne or zero-IF receiver, except that the frequency mixer in the superheterodyne receiver mixes the incoming signal not to baseband, but rather to a band-pass signal (not including DC) called an intermediate frequency or IF. If the incoming signal is centered on a frequency F_rf, and the local oscillator frequency has a frequency F_lo, the intermediate frequency F_if=abs(F_rf−F_lo) where abs( ) denotes the absolute value operator. To achieve channel selectivity in the superheterodyne receiver, a band-pass filter at the intermediate frequency is used to reject unwanted signals. By choosing an IF pass-band that is much less than the signal frequency, but not including baseband, the superheterodyne receiver can generally achieve a good compromise between ease of filter design, and filter frequency stability.

Although superheterodyne receivers are often somewhat more complex than homodyne receivers, and they thus often consume more power than a homodyne receiver, they may have practical advantages in some cases. Because the superheterodyne receiver's IF does not extend all the way to baseband (e.g. DC), the 1/f noise in the superheterodyne receiver's active devices plays much less of a role in the IF signal-to-noise ratio compared to the baseband signals of the homodyne case. Further, because the IF does not extend all the way to baseband, the second order nonlinearity requirements of the receiver's mixer are not as stringent compared to the homodyne case. Finally, any DC offsets in the superheterodyne receiver's mixer and amplifier stages can easily be rejected since those DC offsets may be by definition at zero frequency which may not be in the IF pass band.

A significant disadvantage of the superheterodyne receiver, however, is the power consumption in the LO. Just as in the aforementioned homodyne case, a PLL frequency synthesizer is often used to generate a stable LO frequency by phase locking a VCO to a quartz reference oscillator. The LO is then offset-tuned either above the signal passband (so-called "high side injection") or below the signal passband (so-called "low side injection") and thus the difference between the desired signal and the LO frequencies is set to the IF frequency. Because the IF is generally much less than the signal frequency, the LO must therefore generally be close in frequency to the desired signal, and thus the LO generation circuitry must run at a relatively high frequency. Just as in the homodyne case, in practice the LO typically consumes a significant fraction of the total power consumed by the receiver.

SUMMARY

Examples of systems are described herein. An example system may include a carrier source configured to provide a wireless carrier signal, a wireless communication device, the wireless communication device separate from the carrier source, and the wireless communication device configured to provide a wireless communication signal containing data, and a receiver. The receiver may include an antenna positioned to receive the wireless carrier signal and the wireless communication signal, a two-port mixer coupled to the antenna and configured to mix the wireless carrier signal and the wireless communication signal to provide an intermediate frequency signal, and a demodulator configured to extract, at least in part, the data from the intermediate frequency signal.

In some examples, the wireless carrier signal comprises a continuous wave signal.

In some examples, the carrier source comprises a wireless access point or wireless router and the wireless communication device comprises a smartphone.

In some examples, the two-port mixer comprises a diode configured to perform mixing.

In some examples, systems may further include a low-pass filter coupled to the two-port mixer and configured to provide a direct current (DC) signal. In some examples, the direct current (DC) signal is used to provide at least a portion of operating power for the receiver.

In some examples, the demodulator comprises an I/Q demodulator. In some examples, the demodulator comprises an FM discriminator.

In some examples, the receiver may further include additional receiver circuitry configured to extract, at least in part, the data using a self-generated local oscillator signal; and a processing unit coupled to the two-port mixer and the additional receiver circuitry, the processing unit configured to cause the receiver to extract the data using either the additional receiver circuitry or the two-port mixer based, at least in part, on a DC power level available to the receiver.

In some examples, the wireless carrier signal has a carrier frequency and the wireless communication signal has a communication frequency, and the intermediate frequency signal comprises an intermediate frequency that is a mixing product of the carrier frequency and the communication frequency.

In some examples, systems may further include a plurality of wireless communication devices, each configured to provide a respective wireless communication signal encoding respective data; and wherein the demodulator is configured to extract, at least in part, the respective wireless communication signals using the intermediate frequency signal.

Examples of receivers are described herein. An example receiver may include an antenna, a two-port mixer coupled to the antenna, the two-port mixer configured to mix a carrier signal and a wireless communication signal incident on the antenna to provide an intermediate frequency signal, wherein the wireless communication signal includes data, a demodulator configured to demodulate the intermediate frequency signal to, at least in part, extract the data, and a low-pass filter coupled to an output of the two-port mixer and configured to provide a DC signal.

In some examples, the receiver further comprises a backscatter modulator configured to transmit data using the antenna to backscatter the carrier signal, and the backscatter modulator is configured to be powered, at least in part, by the DC signal.

In some examples, receivers may further include a processing unit, wherein the processing unit is configured to receive the data, and wherein the processing unit is configured to provide transmission data to the backscatter modulator.

In some examples, receivers may further include energy harvesting circuitry, and the backscatter modulator may be configured to be powered, at least in part, by the energy harvesting circuitry.

In some examples, the carrier signal comprises a continuous wave signal.

In some examples, the two-port mixer comprises a diode connected as a mixing element.

In some examples, receivers may further include an intermediate frequency amplifier coupled to the two-port mixer and configured to amplify the intermediate frequency signal and provide an amplified intermediate frequency signal to the demodulator.

In some examples, the intermediate frequency amplifier is powered at least in part by the DC signal.

In some examples, the demodulator is powered at least in part by the DC signal.

In some examples, the carrier signal has a carrier frequency and the wireless communication signal has a communication frequency, and the intermediate frequency signal has an intermediate frequency comprising a mixing product of the carrier frequency and the communication frequency.

Examples of methods are described herein. An example method may include positioning an antenna such that a carrier signal from a carrier source and a wireless communication signal from a data source, separate from the carrier source, are incident on the antenna, mixing the carrier signal and the wireless communication signal using a diode to provide an intermediate frequency signal, and extracting data from the wireless communication signal using the intermediate frequency signal.

In some examples, the carrier signal comprises a continuous wave signal.

In some examples, the carrier signal has a carrier frequency and the wireless communication signal has a communication frequency, and mixing comprises mixing to provide the intermediate frequency signal having an intermediate frequency comprising a mixing product of the carrier frequency and the communication frequency.

In some examples, methods may further include filtering out a DC signal after mixing the carrier signal and the wireless communication signal.

In some examples, methods may further include powering, at last in part, a transmitter using the DC signal.

In some examples, methods may further include powering, at least in part, a processing unit using the DC signal.

In some examples, the transmitter comprises a backscatter modulator.

DETAILED DESCRIPTION

Figure 1:
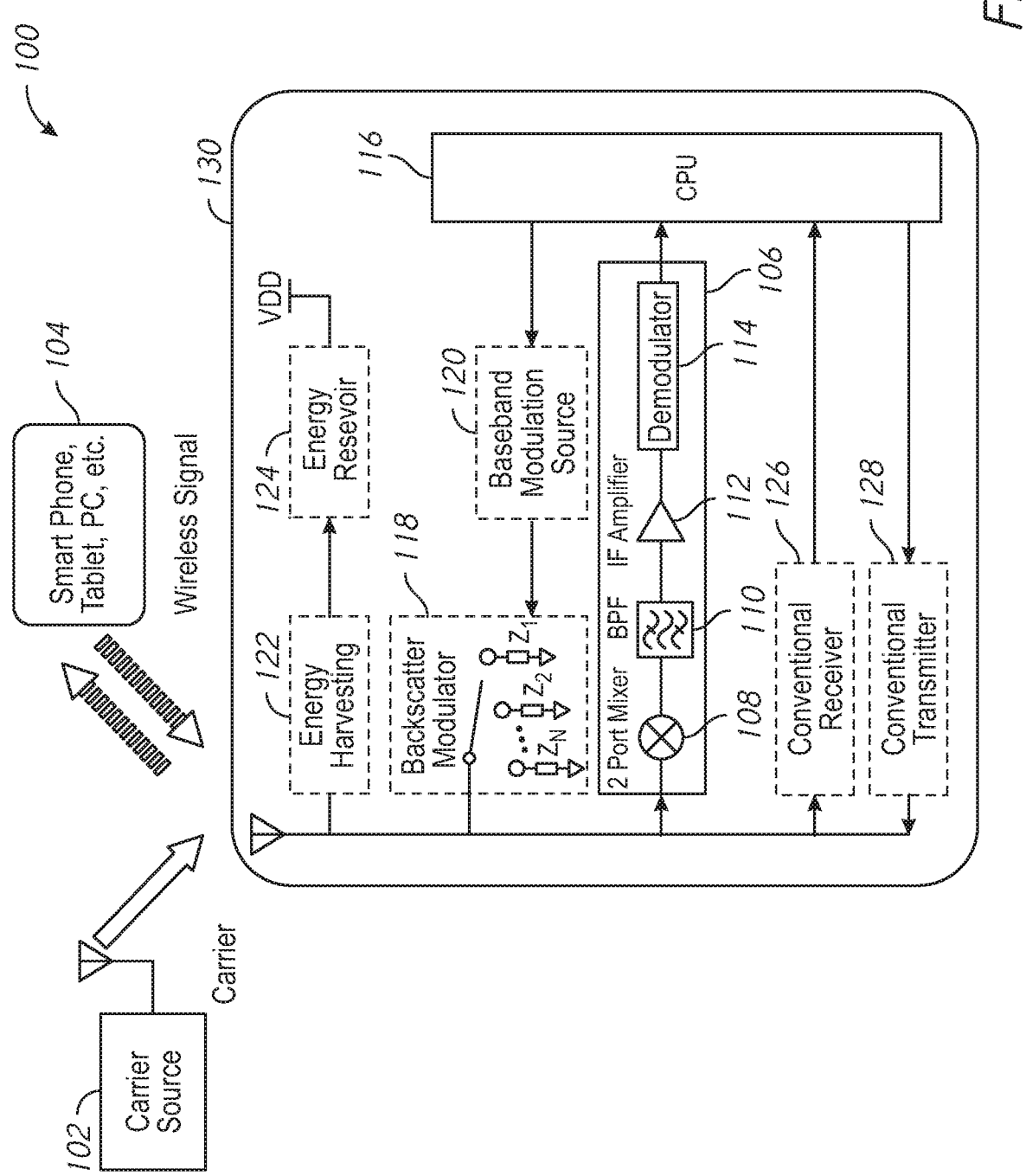
FIG. 1 is a schematic illustration of a system arranged in accordance with examples described herein.

Certain details are set forth below to provide a sufficient understanding of described examples. However, it will be clear to one skilled in the art that other examples may be practiced without various of these particular details. In some instances, well-known circuits, control signals, timing protocols, and software operations have not been shown in detail in order to avoid unnecessarily obscuring the described examples.

Conventional wireless receivers, such as homodyne (zero-F) and superheterodyne receivers, may consume significant power when operating. In many existing low power wireless devices, such as sensors or mobile devices, duty-cycling is employed to reduce the average power of the receiver system, but it would be desirable to continuously operate a receiver to avoid problems of dropped packets, increased message latency, or complex receiver scheduling. Examples described herein include ultra-low power receiver architectures and associated methods which may dramatically reduce the power consumption of a wireless receiver of a sensor or mobile device compared to conventional wireless receivers.

Examples described herein provide a wireless receiver topology which may be used for sensors and mobile devices in some examples. Example wireless receiver topologies described herein may consume significantly less power than conventional receiver architectures, while retaining compatibility with existing wireless standards used by mobile devices. Such existing wireless standards include Wi-Fi (IEEE 802.11), Bluetooth, IEEE 802.15.4, Zigbee, Z-Wave, and their variants and derivatives. In typical mobile devices, a conventional homodyne or superheterodyne receiver is used to receive the signals generated by other mobile devices, or by fixed access points or base stations. This receiver is often operated with a duty-cycled approach to reduce the average power consumed by the receiver.

Such a duty cycled receiver approach may have many disadvantages including increased protocol complexity to accommodate devices that listen to the communication channel only periodically, increased message latency due to the reduced duty cycle, decreased communication channel reliability when the device is moving through fading channels, and decreased responsiveness and update rate of the device's display or application software. The average throughput of the wireless communication link is also reduced by the duty cycle factor. Examples described herein may provide a wireless receiver that can be operated either continuously, or at a much higher duty cycle compared to a conventional wireless receiver.

Examples described herein may provide low power receivers for battery-powered sensors, battery-powered devices such as smart watches, smart phones, wearable electronics, and implantable electronics such as pacemakers, neural interfaces, deep brain stimulators, and other implantable biomedical devices.

Examples described herein may provide a low power superheterodyne or homodyne receiver that takes advantage of an externally generated signal as its local oscillator, such as an external signal (e.g. a carrier signal) that provides wireless power to a sensor or mobile device. Such an external system could be provided by a dedicated continuous-wave (CW) transmitter, or the transmitter of an access point or another sensor or mobile device. In the case of a wirelessly powered sensor or mobile device, examples described herein may enable at least one sensor or mobile device to derive at least part of its operating power from the power contained in an external signal (e.g. a carrier signal), while simultaneously enabling the sensor or mobile device to receive communication signals from other sensors, mobile devices, access points, base stations, etc.

By using an externally-supplied signal as the local oscillator signal, the power consumption of the electronics on example receiving devices (e.g. sensor or mobile devices incorporating example receivers described herein) may be greatly reduced compared to conventional superheterodyne or homodyne receivers in which an LO frequency source such as a PLL frequency synthesizer is employed. Examples described herein may accordingly provide a new type of low power receiver that retains the sensitivity and selectivity advantages of the superheterodyne receiver topology while having a significant advantage in power consumption compared to conventional superheterodyne receivers.

A variety of advantages of examples of systems, devices, and methods are described herein. Moreover, a variety of drawbacks of conventional systems, devices, and methods are described herein. It is to be understood, however, that not all example systems may exhibit all, or even any, of the described advantages, and that not all example systems may address all, or even any, of the described drawbacks of conventional systems.

FIG. 1 is a schematic illustration of a system arranged in accordance with examples described herein. The system 100 of FIG. 1 includes carrier source 102, wireless communication device 104, and receiver device 130. The receiver device 130 may include receiver 106. The receiver 106 may include two-port mixer 108, bandpass filter 110, intermediate frequency amplifier 112, and demodulator 114. The receiver device 130 may further include processing unit 116. The receiver device 130 may further include backscatter modulator 118 and baseband modulation source 120 for providing backscatter transmission. The receiver device 130 may further include energy harvesting circuitry 122 and energy storage 124 for providing power for all or portions of the receiver device 130. The receiver device 130 may further include additional receiver circuitry 126 and additional transmitter circuitry 128.

The carrier source 102 may be implemented using any of a variety of electronic devices and may provide a carrier signal. The carrier signal may be a wireless carrier signal and may have a carrier frequency. In some examples, the carrier signal may be a continuous wave signal (e.g. the carrier signal may have a single frequency). Electronic devices usable to implement the carrier source 102 include, but are not limited to, routers, computers, base stations, a dedicated continuous-wave (CW) transmitter, a transmitter of an access point, a transceiver, or another sensor or mobile device. In some examples, multiple carrier sources may be provided. For example, carrier sources may be distributed about an environment (e.g. throughout a building, area, room, floor, city, neighborhood), so as to provide coverage for receiver devices, such as receiver device 130, which may be present at any location in the environment.

It should be understood that the carrier signal may either be modulated or unmodulated. It should also be understood that the carrier signal may alternate between periods of modulation and being unmodulated. One such example is an approach wherein the carrier signal is unmodulated until a message is to be sent by the transmitter or transceiver to the receiver device 130, or to another device such as an access point. Then the carrier signal may be modulated to carry the message. After the message has been sent (and optionally acknowledged), the carrier signal may return to an unmodulated state.

The system 100 includes wireless communication device 104. The wireless communication device 104 may generally be implemented using any electronic device capable of transmitting a wireless communication signal. Examples of electronic devices which may be used to implement wireless communication device 104 include, but are not limited to, computers, smartphones, wearable devices, implanted devices, tablets, other sensors, mobile devices, access points, and base stations. The wireless communication signal provided by the wireless communication device 104 may utilize any wireless communication protocol, including but not limited to, Wi-Fi (e.g. IEEE 802.11), Bluetooth, IEEE 802.15.4, Zigbee, Z-Wave, and their variants and derivatives. The wireless communication signal may generally be implemented using a radio frequency (RF) signal. Generally, the wireless communication signal may contain (e.g. encode) data intended to be transmitted by the wireless communication device 104. In this manner, the wireless communication device may serve as a data source which is separate from the carrier source 102. While a single wireless communication device 104 is shown in system 100, any number may be present, including, but not limited to 2, 3, 4, 5, 6, 7, 8, 9, 10, or more wireless communication devices. In examples described herein, receiver devices, such as receiver device 130 may receive and extract wireless communication signals from multiple wireless communication devices using a carrier signal received from a single carrier source. The wireless communication device 104 may be separate from the carrier source 102. For example, the wireless communication device 104 may be a different device from the carrier source 102. The wireless communication device 104 may transmit the wireless communication signal using a different antenna than the carrier source 102 uses to transmit the carrier signal. The wireless communication device 104 may utilize a different power source to power the transmission of the wireless communication signal than the carrier source 102 uses to power the transmission of the carrier signal. The wireless communication device 104 may utilize a different transmitter to transmit the wireless communication signal than the carrier source 102 uses to transmit the carrier signal. The carrier source 102 may be in a different physical location than the wireless communication device 104.

The receiver device 130 may be implemented using a variety of electronic devices, including, but not limited to a tag such as an RFID tag, a computer, a wearable device, a wireless sensor, or combinations thereof. The receiver device 130 may be implemented in and/or in communication with a sensor device or mobile device. For example, the receiver device 130 may be implemented in and/or in communication with battery-powered sensors, battery-powered devices such as smart watches, smart phones, wearable electronics, and/or implantable electronics such as pacemakers, neural interfaces, deep brain stimulators, or other implantable biomedical devices. Wireless communication signals received by the receiver device 130 described herein may include data representative of a command or other data for a sensor or mobile device integrated with and/or in communication with receiver device 130. The receiver device 130 may advantageously be capable of very low power receiving of wireless communication signals using incident carrier signals. The receiver device 130 may include an antenna positioned to receive the carrier signal from the carrier source 102 and the wireless communication signal from the wireless communication device 104 and/or other wireless communication signals in the environment. For example, the carrier signal and the wireless communication signal may be incident on an antenna of the receiver device 130. While a single antenna is shown in the receiver device 130 of FIG. 1, any number of antennas may be provided in other examples.

The receiver device 130 may include receiver 106. The receiver 106 may include two-port mixer 108, bandpass filter 110, intermediate frequency amplifier 112, and demodulator 114. Two-port mixers described herein, including two-port mixer 108, may have two ports—one for receipt of both a radio frequency (RF) signal and a carrier signal, which may be used by the two-port mixer in lieu of a local oscillator signal, and a second port for output of an intermediate frequency signal. Two-port mixers described herein are in contrast with conventional three-port mixers. Conventional three-port mixers may provide two separate input ports and one output port—one of the input ports serving to accept the input of an RF signal, one of the input ports serving to accept a local oscillator signal, with the output port serving to output an intermediate frequency. Two-port mixers described herein may include additional output ports in some examples (e.g. for providing a DC signal as described herein), but generally have a single input port for receipt of both a wireless communication signal and a carrier signal. For example, the wireless communication signal and the carrier signal may be input to the two-port mixer 108 using a same input node and/or input pathway or portion thereof. The two-port mixer 108 may mix the carrier signal and the wireless communication signal using a mixing element. Examples of mixing elements include, but are not limited to, nonlinear devices such as diodes, transistors, or combinations thereof. The two-port mixer 108 may provide an output of an intermediate frequency signal (e.g. a signal having an intermediate frequency which may be a mixing product of a frequency of the wireless communication signal and a frequency of the carrier signal). The mixing product of the frequency of the wireless communication signal and the frequency of the carrier signal may, for example, be a sum and/or difference between the frequency of the wireless communication signal and a frequency of the carrier signal. In some embodiments, the difference frequency may be preferred as it is lower than either the frequency of the wireless communication signal and the frequency of the carrier signal.

Having obtained an intermediate frequency signal, the receiver 106 may process the intermediate frequency signal to recover data from the wireless communication signal. For example, the receiver 106 may include optional bandpass filter 110 which may have a filter transfer function and filter the intermediate frequency signal to provide a filtered intermediate frequency signal. The receiver 106 may include optional intermediate frequency amplifier 112 which may amplify the filtered intermediate frequency signal, and/or demodulator 114 which may demodulate the filtered intermediate frequency signal to extract data from the filtered intermediate frequency signal (which may represent the data from the wireless communication signal). Examples of demodulators which may be used include I/Q demodulators and FM discriminators. In this manner, receiver 106 may avoid a need for an internally generated local oscillator signal (e.g. the carrier signal may be used in lieu of an internally generated local oscillator signal) to receive data in the wireless communication signal. Removing or reducing a need for an internally generated local oscillator signal may reduce power demands of the receiver 106.

In some examples where the carrier signal is modulated, the receiver 106 may optionally exploit properties of the carrier signal modulation to allow it to use the modulated carrier signal as its local oscillator. For example, if the carrier signal modulation is orthogonal to the desired wireless communication signal to be received by the receiver device 130, the receiver 106 may reject the unwanted carrier signal modulation and continue to demodulate the desired wireless communication signal. In some examples, the carrier signal is amplitude modulated but the desired wireless communication signal is angle modulated (e.g. frequency or phase modulated). Accordingly, the receiver 106 may ignore the changes in amplitude of the LO and IF signals and continue to demodulate the IF signal as an angle modulated signal. In some examples, the carrier signal may be modulated with e.g. a spread spectrum code that is different from a spread spectrum code used by the desired wireless communication signal. Assuming that these two-codes have low cross-correlation, the receiver 106 may continue to receive the desired wireless communication signal even though it has a secondary modulation due to the modulation of the carrier signal.

In some examples, the carrier signal may be frequency modulated, as in a FSK data stream, and the wireless communication signal may also be frequency modulated. Assuming that the wireless communication signal is stronger than the carrier signal, the FM capture effect may allow the receiver 106 to demodulate the desired wireless signal even though the carrier signal is also varying in frequency. In some such examples, the carrier signal may comprise a communication signal sent by another device that is merely providing a carrier signal and not communicating its own data to the receiver 106.

Accordingly, the receiver device 130 may receive a wireless communication signal and a carrier signal and may utilize a two-port mixer to provide an intermediate frequency signal. Data contained in the wireless communication signal may be decoded from the intermediate frequency signal. In some examples, a plurality of wireless communication devices may be provided in system 100, and each may provide a respective wireless communication signal encoding respective data. The receiver device 130 may decode, at least in part, the respective wireless communication signals using intermediate frequency signals provided by the receiver 106.

It should be appreciated that the IF signal resulting from a mixing product (e.g. difference) between the wireless communication signal and carrier signal frequencies may take on any frequency range, including traditional IF frequencies such as 455 kHz, 10.7 MHz, 45 MHz, or 110 MHz, as well as low-IF frequencies or an "uncertain intermediate frequency" which is not known a priori but is instead allowed to occupy a relatively wide range of frequencies. It should further be appreciated that this approach, while described herein as a superheterodyne topology with an IF not including baseband, may also be applied to yield a homodyne or zero-IF topology simply by repositioning the LO frequency relative to the RF channel, and by designing an appropriate IF filter to accommodate the baseband transfer function.

A variety of demodulation techniques may be used by demodulator 114 to extract data. Example techniques using an FM discriminator are described with reference to FIG. 7. Example techniques using an I/Q demodulator are described with reference to FIG. 8.

In some examples, other approaches to demodulation may be employed and used to implement demodulator 114. For example, a pulse-counting demodulator for frequency modulation may be used, or a quadrature detector for frequency or phase modulation.

In examples where a wireless communication signal from wireless communication device 104 may occupy one or more of several different channels, at least two different approaches may be used.

In some examples, the receiver device 130 (e.g. the receiver 106) may operate with a fixed IF frequency. Carrier source 102 may transmit a number of different carrier source frequencies in sequence (such as a frequency hopping sequence) such that the sum or difference between each of the carrier signal frequencies and the fixed IF frequency corresponds to each of the channels desired to be received. In some examples, the receiver device 130 may communicate with the carrier source including a message indicating a desired frequency that the carrier source is to transmit. In some examples, the carrier source selects its own carrier signal frequency and transmits a message to the receiver device indicating the carrier signal frequency for further processing by the receiver device.

In some examples, the carrier source 102 may provide a carrier signal having a fixed carrier signal frequency. In such examples, the receiver 106 may use one of two approaches to receive multiple channels. In some examples, the receiver 106 may use a tunable IF frequency, for example via a tunable bandpass filter used to implement bandpass filter 110, or by a bank of bandpass filters corresponding to the IF frequencies of the channels to be received. In some examples, the receiver 106 may use a demodulation approach of FIG. 8 wherein the total IF bandwidth is equal to the bandwidth of multiple wireless communication channels to be received, while the LO frequency used by the I/Q demodulator is changed to different frequencies to enable demodulation of one wireless communication channel at a time.

It should further be appreciated that the receiver 106 need not be confined to demodulate a single modulation type or wireless communication standard. In some examples, the receiver 106 may use one or more demodulators, or a reconfigurable demodulator, or reconfigurable software executed by the processing unit to demodulate multiple different modulation types, including different data rates and different wireless communication standards.

While not shown in FIG. 1, in some examples, a low-pass filter may be coupled to the two-port mixer and may provide a direct current (DC) signal output, which may be used to power the receiver 106 and/or other portions of the receiver device 130.

In some examples, the receiver device 130 may further include backscatter modulator 118. The backscatter modulator 118 may be coupled to a baseband modulation source 120 (e.g. a symbol generator) and may backscatter the carrier signal from the carrier source 102 to provide transmitted data from the receiver device 130. Data may be provided from processing unit 116 to the baseband modulation source 120. The baseband modulation source 120 may provide a subcarrier which may be amplitude, frequency, and/or phase modulated to yield a backscatter signal having one or more sidebands corresponding to a desired wireless communication standard. Generally, the backscatter modulator 118 and/or the baseband modulation source 120 may implement backscatter techniques which may generally be low-power transmission techniques. For example, the backscatter modulator 118 may alter an impedance of an antenna of the receiver device 130 to reflect and/or absorb portions of the carrier signal in accordance with data to be transmitted by the receiver device 130. For example, the backscatter modulator 118 may have two or more selectable impedances. Generally, any backscatter techniques and/or backscatter modulators may be used.

The receiver device 130 may include processing unit 116. The processing unit 116 may generally be implemented using, e.g. one or more processor(s) and/or custom circuitry (e.g. ASICs) to provide processing described herein. In some examples, the processing unit 116 may receive data decoded and/or partially decoded from receiver 106. In some examples, the processing unit 116 may provide data for transmission to backscatter modulator 118. Processing unit 116 may perform other control and/or decision functions described herein (e.g. related to use of additional receiver circuitry 126, additional transmitter circuitry 128, and/or energy harvesting circuitry 122).

In some examples, the receiver device 130 may further include additional receiver circuitry 126 and/or additional transmitter circuitry 128. The additional receiver circuitry 126 and/or additional transmitter circuitry 128 may implement a more conventional, potentially higher-power receiver and/or transmitter architecture (e.g. the additional receiver circuitry 126 and/or the additional transmitter circuitry 128 may include a self-generated local oscillator signal). The receiver device 130 may activate and/or utilize the additional receiver circuitry 126 and/or additional transmitter circuitry 128 during particular periods of time—e.g. when processing unit 116 determines sufficient power is available for use of additional receiver circuitry 126 and/or additional transmitter circuitry 128. For example, the processing unit 116 may cause the receiver device 130 to decode data from the wireless communication signal using either the additional receiver circuitry 126 or the receiver 106 having the two-port mixer 108 based, at least in part, on a power level available to the receiver device 130. In some examples, the receiver device 130 may activate and/or utilize the additional receiver circuitry 126 and/or additional transmitter circuitry 128 when a carrier signal is not present in the environment (e.g. when the carrier source 102 is not present, is off, or is out of range). For example, the processing unit 116 may cause the receiver device 130 to decode data from the wireless communication signal using either the additional receiver circuitry 126 or the receiver 106 having the two-port mixer 108 based, at least in part, on the availability of a carrier signal at the receiver device 130.

In some examples, one or more components, e.g. a mixer, IF filter, demodulator, etc. may be shared between the receiver 106 and the additional receiver circuitry 126, which may utilize its own LO. For example, the additional receiver circuitry 126 may utilize portions of two-port mixer 108, intermediate frequency amplifier 112, bandpass filter 110, and/or demodulator 114. In some examples, a signal from the receiver 106 may be routed into a demodulator of a conventional receiver (e.g. Additional receiver circuitry 126). In some examples, the IF frequency of receiver 106 may be chosen to be the same as the IF frequency of the additional receiver circuitry 126 to facilitate sharing of certain components, e.g. by switching the IF signal path to enable this sharing.

In some examples having both a receiver utilizing a two-port mixer (e.g. Receiver 106) and a more conventional receiver having its own local oscillator (e.g. Additional receiver circuitry 126), at some times, the receiver utilizing the two-port mixer (e.g. Receiver 106) may be used while at other times the more conventional receiver having its own local oscillator may be used. Generally, the processing unit 116 may determine whether to use the low-power receiver utilizing a two-port mixer (e.g. Receiver 106) or the more conventional receiver having its own local oscillator (e.g. Additional receiver circuitry 126) based on decision criteria which may include, for example, the available dc or LO power, information from a previously received packet, a predetermined schedule, or combinations thereof.

In some embodiments, a transition between two receiver options (e.g. Receiver 106 and additional receiver circuitry 126) may include receiving from the same signal source or wireless standard on the different receiver options, or it may receive a different signal source or wireless standard on each receiver. An initial data link connection may be established by either the conventional (e.g. Additional receiver circuitry 126) or low power receiver (e.g. Receiver 106) and then switched depending on signal conditions, harvested energy, reservoir energy, timing, or any other criteria. As receiving devices (e.g. Receiver device 130) move around an environment, or the environment itself changes, the receiver choice may change. In a situation where the carrier source (e.g. Carrier source 102) is physically close to the receiver device 130, it is expected that the low-power receiver (e.g. Receiver device 130) will be the preferred choice from a power perspective, but if the physical separation increases, the insufficient carrier power may be available to drive the LO input to the two-port mixer and a switch to a conventional receiver (e.g. Additional receiver circuitry 126) may be made.

In some examples, a conventional transmitter (e.g. Additional transmitter circuitry 128) may optionally be integrated with the receiver device 130. In such examples, the conventional transmitter may be employed by the receiver device 130 when a greater communication range is desired than is possible with the backscatter modulator 118, and/or when a carrier signal is not available in the environment, which may be determined, for example, by processing unit 116.

In some examples, the receiver device 130 may include energy harvesting circuitry 122 and/or energy storage 124. The energy harvesting circuitry 122 may allow the receiver device 130 to extract power from the environment (e.g. the carrier signal, the wireless communication signal(s) and/or other available RF signals). In other examples the energy harvesting circuitry 122 may extract energy from temperature, vibration, or other environmental parameters. Energy harvested by the energy harvesting circuitry 122 may be stored in energy storage 124. The energy storage 124 may be implemented using, for example, a capacitor, a supercap, and/or a battery. In some examples, the receiver device 130 may be powered entirely, or in part, from the energy harvested by the energy harvesting circuitry 122.

Figure 2:
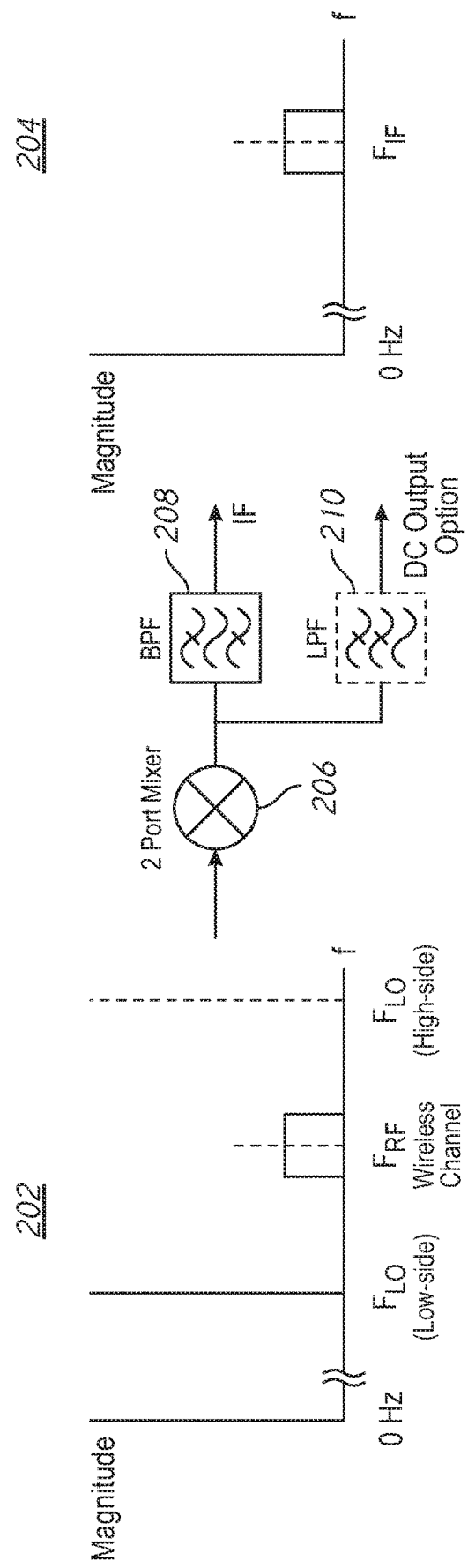
FIG. 2 is a schematic illustration of a two-port mixer and operations thereof arranged in accordance with examples described herein.

FIG. 2 is a schematic illustration of a two-port mixer and operations thereof arranged in accordance with examples described herein. FIG. 2 illustrates two-port mixer 206, bandpass filter 208, and low-pass filter 210. Two-port mixer 206 and bandpass filter 208 may be used to implement and/or may be implemented by two-port mixer 108 and/or bandpass filter 110 of FIG. 1. While not shown in FIG. 1, a low-pass filter analogous to low-pass filter 210 may also be used in the receiver 106 of FIG. 1. FIG. 2 also includes graph 202 and graph 204. Graph 202 depicts frequencies of signals input to the two-port mixer 206. Graph 204 depicts frequencies of intermediate frequency output from bandpass filter 208.

Note that conventional frequency mixers are typically three-port devices, including separate input ports for RF input, local oscillator (LO) input, and IF output. In example two-port mixers described herein, the RF input and the LO input (which may be a carrier signal as described herein) are jointly provided at a first port (e.g. electronic node, input path) of the two-port mixer. The second port of the two-port mixer, an output port, provides energy at the IF frequency band. Accordingly, two ports generally refers to the number of ports used to provide an intermediate frequency output (e.g. one input and one output port). Notwithstanding the term two-port mixer, example two-port mixers described herein may provide other additional outputs (e.g. a DC output may be provided through use of a low-pass filter).

Two-port mixer 206 may receive both an RF and an LO frequency signal (e.g. a wireless communication signal and a carrier signal as described with reference to FIG. 1) and may provide an output including an intermediate frequency signal. The bandpass filter 208 may filter the intermediate frequency signal. The output of the two-port mixer 206 may contain mixing products (e.g. the sum and difference frequencies) of RF and LO frequencies (e.g. a frequency of the wireless communication signal described with reference to FIG. 1 and the carrier signal described with reference to FIG. 1). Bandpass filter 208 may be employed to pass only the desired IF signal, by rejecting the sum of the RF and LO frequencies, and providing the signal at the frequency that is the difference between the RF and LO frequencies (e.g. the difference between the frequency of a wireless communication signal and the frequency of a carrier signal described herein).

Graph 202 illustrates frequencies at an input port of two-port mixer 206. The signals present at the input port may be signals present in the environment of a receiver device into which the two-port mixer 206 is incorporated (e.g. the receiver device 130 of FIG. 1). The frequencies may include $F_{RF}$ (e.g. a frequency of a wireless communication signal described herein) and $F_{LO}$ (e.g. a frequency of a carrier signal described herein).

As shown in graph 202, the LO signal (e.g. the carrier signal) may be either of a higher frequency than the desired wireless communication signal (called high-side injection and illustrated as "high side" in graph 202), or of a lower frequency than the wireless communication signal (called low-side injection and illustrated as "low side" in graph 202). In either case, the difference between the RF and LO signals generally forms the IF signal which is provided at an output of bandpass filter 208. The LO signal may be any carrier signal described herein, which may include, for example an unmodulated carrier, a modulated communication signal, or a signal which periodically alternates between being an unmodulated carrier and a modulated communication signal. The RF signal may be a modulated communication signal.

In some examples, the modulated communication signal is an amplitude modulated signal such as an ASK or OOK signal, while in some examples, the modulated communication signal may be a frequency modulated signal such as an FSK signal. In some examples the FSK signal may be a binary FSK signal with a Gaussian envelope (GFSK). In some examples, the modulated communication signal may be a PSK signal, a QAM signal, or an OFDM signal. In some examples, the modulated communication signal may employ a combination of these techniques. In some examples, the modulated communication signal may be a spread spectrum signal such as a DSSS signal, which may in some examples may be modulated using complimentary code keying (CCK). Such a signal may be used by any conventional wireless standard such as, but not limited to, Wi-Fi (IEEE 802.11), Bluetooth, IEEE 802.15.4, Zigbee, Z-Wave, etc.

In some examples, two-port mixers described herein may include a DC output option (e.g. by providing a low-pass filter, such as low-pass filter 210 to provide a DC output). In such examples, the two-port mixer may simultaneously perform a functions of energy harvesting and downconversion of the modulated communication signal to an IF. Such examples may enable the two-port mixer to extract a DC power component from the RF and/or LO signal inputs (e.g. from the wireless communication signal and/or the carrier signal), while simultaneously extracting the IF signal from the difference between the RF and LO signals.

Figure 3:
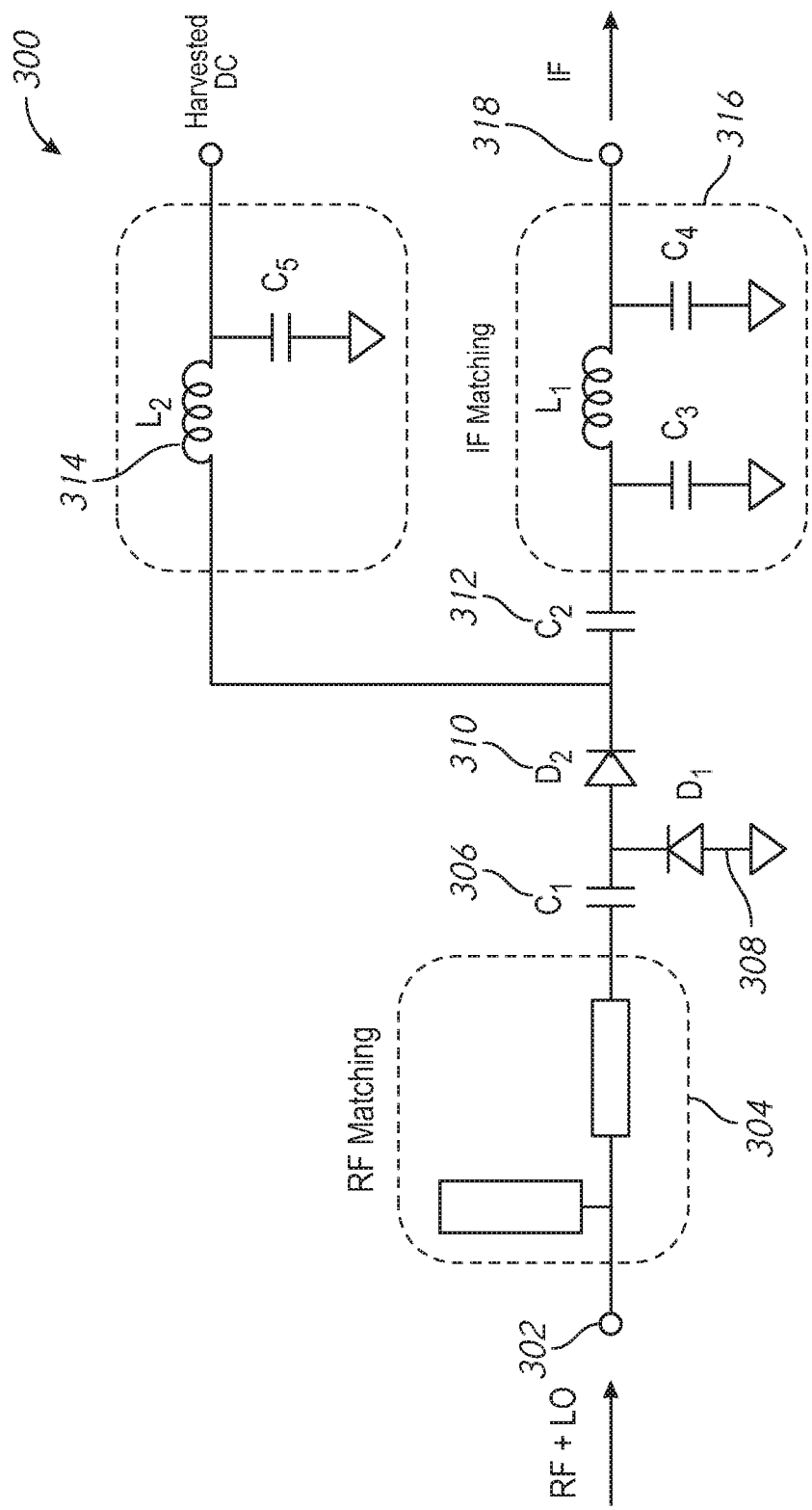
FIG. 3 is a schematic illustration of a two-port mixer arranged in accordance with examples described herein.

FIG. 3 is a schematic illustration of a two-port mixer arranged in accordance with examples described herein. The two-port mixer 300 may be used to implement and/or may be implemented by the two-port mixer 108 of FIG. 1, and/or the two-port mixer 206 of FIG. 2.

RF and LO signals (e.g. wireless communication signals and carrier signals described herein) may be provided at input port 302. The input port 302 may, for example, be an electronic node which may be coupled to an antenna on which the wireless communication signal and carrier signal are incident.

The RF and LO signals are provided to matching network 304. For example, the input port 302 is coupled to the matching network 304. The matching network 304 may impedance match the input port 302 impedance to the impedance of the active device(s) (e.g. the antenna on which the wireless communication signal and/or carrier signals are incident). The matching network 304 may include any number and arrangement of impedance elements, which in some examples may be variable impedance elements, to perform the described matching. In some examples, the impedance may be e.g. 50 ohms in examples where the mixer is connected to a 50 ohm antenna. Such a matching network may be implemented with lumped element and/or transmission line techniques, e.g. a microstrip transmission line network. In some examples, the matching network may be integrated with the other components of a receiver device, e.g. on a single monolithic substrate such as a silicon integrated circuit (IC). In some examples, the matching network 304 may be designed to be relatively narrow band to provide additional frequency selectivity to a receiver incorporating two-port mixer 300. The matching network 304 may optionally be coupled to the two-port mixer 300's semiconductor devices by a dc blocking element such as optional capacitor C2.

In the example of FIG. 3, two-port mixer 300 may be implemented using one or more diodes such as diode 308 and diode 310 as mixing elements. The diode 308 and/or diode 310 may be implemented as Schottky diodes. In some examples, the Schottky diodes may be type HSMS-2860 made by Avago Technologies. In such an implementation, the nonlinear I-V curve of the Schottky diodes may provide the frequency translation function to provide missing products of the RF and LO signals (e.g. the wireless communication signal and carrier signal). In some examples, matching network 314 may be provided to harvest a DC signal from the mixer (e.g. an output of the diode 308 and diode 310). The matching network 314 may include a network of impedance elements (e.g. L2 and C5) serving to pass the DC component at the output of the mixer while providing a high impedance at the IF and signal frequencies. Accordingly, the two-port mixer 300 may simultaneously enable energy harvesting as well as frequency translation.

In some examples, a DC blocking capacitor 312 (e.g. C2) and an IF matching network 316 may allow energy in the IF band to be extracted from the mixer without passing the DC component. Accordingly, an IF signal may be provided at output port 318. The IF matching network 316 may be implemented using impedance elements (e.g. L1, C3, C4). In some examples, the IF matching network may provide additional frequency selectivity to a receiver device by allowing a maximum conversion gain (or loss) at the desired IF frequency band while rejecting other frequency components. In some examples, the RF and LO frequencies may be in the 2.4 GHz band while the IF frequency band may have a range of 10.45 to 10.95 MHz to pass a 500 kHz wide channel bandwidth, centered on 10.7 MHz IF. In some examples, the IF frequency band may occupy 10-11 MHz to pass a 1 MHz wide channel bandwidth. In some examples, the IF frequency may be a frequency band such as 90-110 MHz to pass a 20 MHz wide channel bandwidth.

It should be appreciated that two-port mixers described herein may be implemented with other semiconductor devices, as well as any number of semiconductor devices utilized as mixing elements. In some examples, two-port mixers may include other types of diodes, including conventional PN junction diodes, tunnel or Esakai diodes, diode-connected field effect transistors (FETs), and/or the junction of a bipolar junction transistors (BJTs).

Figure 4:
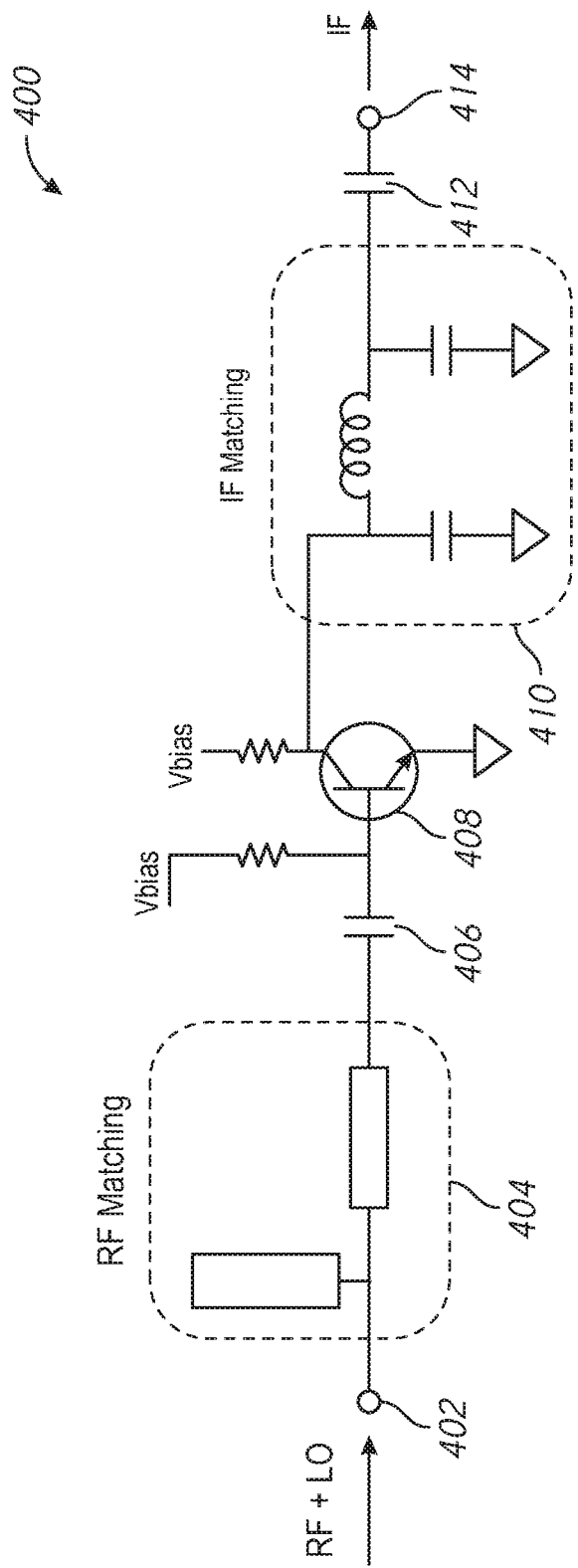
FIG. 4 is a schematic illustration of a two-port mixer arranged in accordance with examples described herein.

FIG. 4 is a schematic illustration of a two-port mixer arranged in accordance with examples described herein. The two-port mixer 400 includes input port 402, matching network 404, capacitor 406, transistor 408, IF matching network 410, capacitor 412, and output port 414. The two-port mixer 400 may be used to implement and/or may be implemented by the two-port mixer 108 of FIG. 1 and/or the two-port mixer 206 of FIG. 2.

In an analogous manner to that described with respect to FIG. 3, RF and LO signals (e.g. wireless communication signals and carrier signals described herein) may be provided at input port 402 and input to matching network 404. The matching network 404 may match an impedance of an active element (e.g. an antenna) used to receive the RF and LO signals. An output of the matching network 404 may be provided to a mixing element after capacitor 406.

In the two-port mixer 400, transistor 408 is used as the mixing element. The transistor 408 may be a BJT transistor, such as in one example the type BFG25 NPN BJT from NXP Inc. In some examples, the transistor 408 (or a diode if a diode is used as a mixing element, such as in FIG. 3), may be biased by any available voltage source, which may adjust its conversion gain compared to the unbiased case. In some examples, mixing element (e.g. Transistor 408) may be self-biased by a voltage extracted from the incoming RF and/or LO signals.

An output of transistor 408 may be provided to IF matching network 410 which may be used to extract intermediate frequencies from the output. An intermediate frequency signal may accordingly be provided at output port 414 after capacitor 412.

Other types of semiconductor devices may be used as mixing elements of two-port mixers described herein. In some examples, a FET or BJT may be used in a three-terminal mode, with the RF and LO signals applied to a gate or a base of the transistor, and the IF signal being extracted from the drain or collector of the transistor. In some examples, an interconnection of multiple FETs or BJTs may be employed, as in a Gilbert cell mixer. Such three-terminal devices may include the advantage of improved conversion gain compared to the diode approach in some examples. In some examples a cascode connection of a mixing element and an amplifier device may be employed, with an attendant increase in conversion gain and port-to-port isolation when compared to a single device mixer in some examples.

Figure 5:
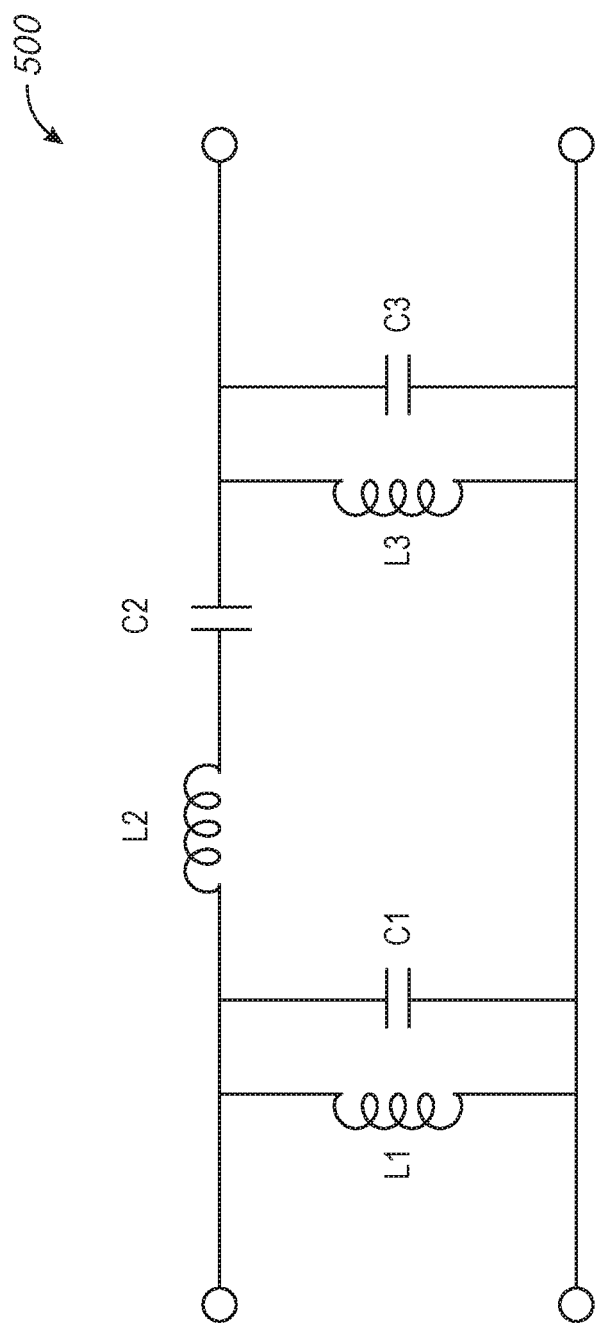
FIG. 5 is a schematic illustration of a bandpass filter arranged in accordance with examples described herein.

FIG. 5 is a schematic illustration of a bandpass filter arranged in accordance with examples described herein. Bandpass filter 500 may be used to implement and/or may be implemented by the bandpass filter 110 of FIG. 1 and/or the bandpass filter 208 of FIG. 2 in some examples.

In some examples, a bandpass filter may be provided to filter an output of two-port mixers described herein, and may be provided either before or after an IF amplifier in some examples. The purpose of the IF bandpass filter may be to serve as a channel select filter to pass the desired IF pass-band corresponding to the wireless communication channel, while rejecting unwanted mixing products.

The bandpass filter 500 includes a passive L/C (inductor and capacitor) circuit that has a passband of approximately 10-12 MHz. In other examples, the IF filter may be implemented with active circuit components more suitable for integration onto a single chip, such as integrated R-C filters, and/or gm-C filters and/or a switched-capacitor filter. In some examples, multiple filter types may be combined to achieve an optimal filter transfer function. In some examples, a ceramic or crystal piezoelectric filter, or a surface acoustic wave (SAW) or bulk acoustic wave (BAW) filter may be used to implement the bandpass filter.

Figure 6:
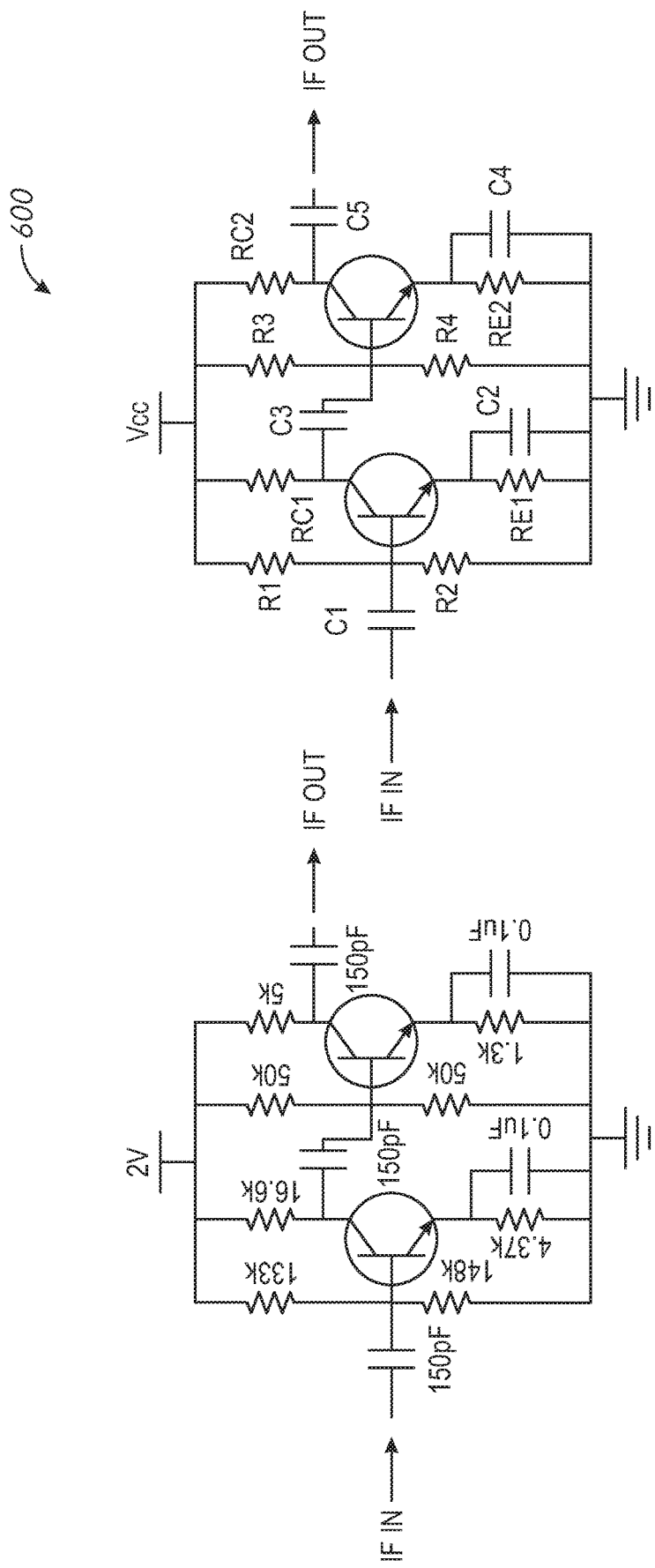
FIG. 6 is a schematic illustration of an IF amplifier arranged in accordance with examples described herein.

FIG. 6 is a schematic illustration of an IF amplifier arranged in accordance with examples described herein. The intermediate frequency amplifier 600 may be used to implement and/or may be implemented by intermediate frequency amplifier 112 of FIG. 1 in some examples. Two schematics of embodiments of intermediate frequency amplifier 600 are shown in FIG. 6—one with element names and another with exemplary values.

In some examples, an IF amplifier may be desirable to provide additional gain to the receiver signal chain. In some embodiments, the IF amplifier may be connected in line following a bandpass filter so that unwanted mixing products are rejected prior to amplification. Suitable topologies for the IF amplifier may include cascaded common-emitter BJT or common-source FET stages, or a differential cascade. In some examples, the source legs of a FET differential cascade may be split to enable DC rejection in the amplifier stages. This may enable higher IF gain in some examples while reducing the impact of DC offsets in the amplifiers.

The intermediate frequency amplifier 600 includes two common-emitter BJT stages. The total gain of these two stages in this example exceeds 20 dB over the 10-12 MHz IF frequency range. In some examples, the total power consumed by the IF amplifier may be less than 500 microwatts. In some examples, the amplifier may enter amplitude limiting around −45 dBm referred to the amplifier's input. A limiting amplifier may be desirable in the case of an FM, FSK, or PSK receiver as these are constant envelope signals, while in other embodiments a linear transfer function may be desirable for e.g. ASK, QAM, or OFDM signals.

Figure 7:
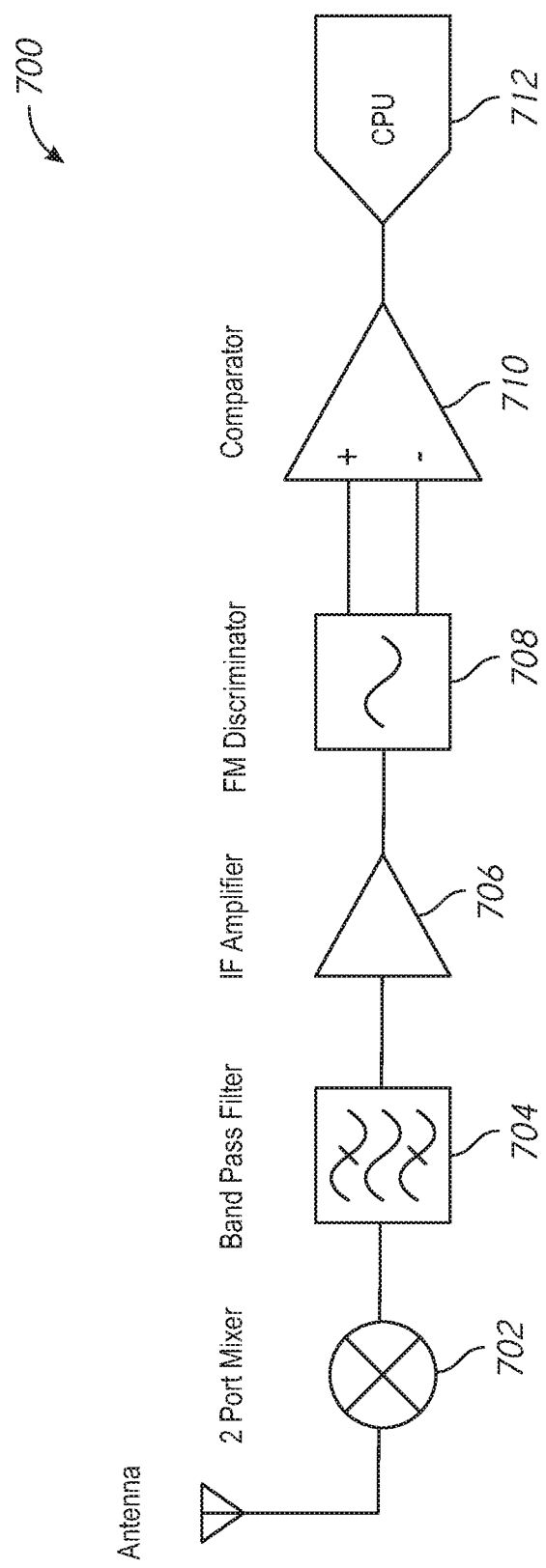
FIG. 7 is a schematic illustration of a receiver arranged in accordance with examples described herein.

FIG. 7 is a schematic illustration of a receiver arranged in accordance with examples described herein. The receiver 700 may be used to implement and/or may be implemented by, wholly or partially, the receiver 106 of FIG. 1. The receiver 700 includes two-port mixer 702, bandpass filter 704, IF amplifier 706, FM discriminator 708, comparator 710, and processing unit 712.

The two-port mixer 702 may be coupled to an antenna and may receive at an input port a wireless communication signal and carrier signal incident on the antenna. The two-port mixer 702 may be used to implement and/or implemented by the two-port mixer 108 of FIG. 1, two-port mixer 206 of FIG. 2, two-port mixer 300 of FIG. 3, and/or two-port mixer 400 of FIG. 4, for example. An output of the two-port mixer 702 may be coupled to bandpass filter 704, which may be implemented by and/or used to implement any bandpass filter described herein. The bandpass filter 704 may provide an intermediate frequency signal to the IF amplifier 706. The IF amplifier 706 may amplify the intermediate frequency signal and provide the amplified intermediate frequency signal to the FM discriminator 708.

Accordingly, in examples where the desired modulation type is binary frequency shift keying (2-FSK), the demodulation function may be provided by FM discriminator 708. For example, FM discriminator 708 may be used to implement the demodulator 114 of FIG. 1. Generally, a variety of discriminators may be used to implement FM discriminator 708 such as a Foster-Seeley discriminator or another such FM demodulation function.

An output of the FM discriminator 708 may be provided to comparator 710. For example, in the case of FSK demodulation using a frequency discriminator such as the Foster-Seeley discriminator, the two ratiometric outputs can be applied to a comparator (sometimes called a one-bit analog-to-digital converter) such that the presence of one of the two signal frequencies results in a binary one at the output of the comparator, and the other signal frequency results in a binary zero at the output of the comparator. This comparator output bit may be supplied to processing unit 712 such that the processing unit 712 can decode incoming packets being sent from a nearby wireless device.

The processing unit 712 may be used to implement and/or may be implemented by the processing unit 116 in some examples.

In some examples utilizing Bluetooth Low Energy (sometimes called BLE or Bluetooth Smart) standard, the two-port mixer 702 may be implemented using a Schottky diode two-port mixer using type HSMS-2860 Schottky diodes. In some examples, the Schottky diode mixer may also be used to harvest power from the incoming signal.

In some examples, the bandpass filter 704 may be implemented using an L-C bandpass filter with a pass band of 10-12 MHz to pass a 1 Mbps, 2-FSK signal with a frequency deviation of up to +/−500 kHz (+/−370 kHz in some examples). Assuming that a particular BLE channel is to be received, the external carrier source may supply energy at a frequency approximately 11 MHz above or below the desired BLE channel depending on whether high-side or low-side injection is used. In some examples, IF amplifier 706 may have a gain of 20 dB to amplify the IF signal after bandpass filtering, and a Foster-Seeley discriminator is used to implement FM discriminator 708 to demodulate the 2-FSK signal to obtain a ratiometric signal which is applied to comparator 710 which may be a low power, high speed comparator such as the TI TLV3201 comparator made by Texas Instruments, Inc. The output of the comparator is thus a single bit that is high when the input signal frequency is above the 11 MHz IF center frequency and low when the input signal frequency is below the 11 MHz IF center frequency.

In some examples, the comparator 710 may not be used. Instead, the two outputs of the FM discriminator 708 (e.g. a Foster-Seeley discriminator) may be fed to two analog-to-digital converter inputs on the processing unit 712, which may be a central processing unit. The processing unit 712 may then digitize the stream of ratiometric data and perform the frequency discrimination in software. For example, the processing unit 712 may be coupled to memory which may be encoded with executable instructions for frequency discrimination. The processing unit 712 may execute the instructions to perform frequency discrimination and demodulate the data.

In some examples, instead of employing a frequency discriminator, such as FM discriminator 708, the IF frequency signal (e.g. 11 MHz signal) may be fed directly to an analog-to-digital converter and the IF signal may then be digitized and digitally demodulated.

Figure 8:
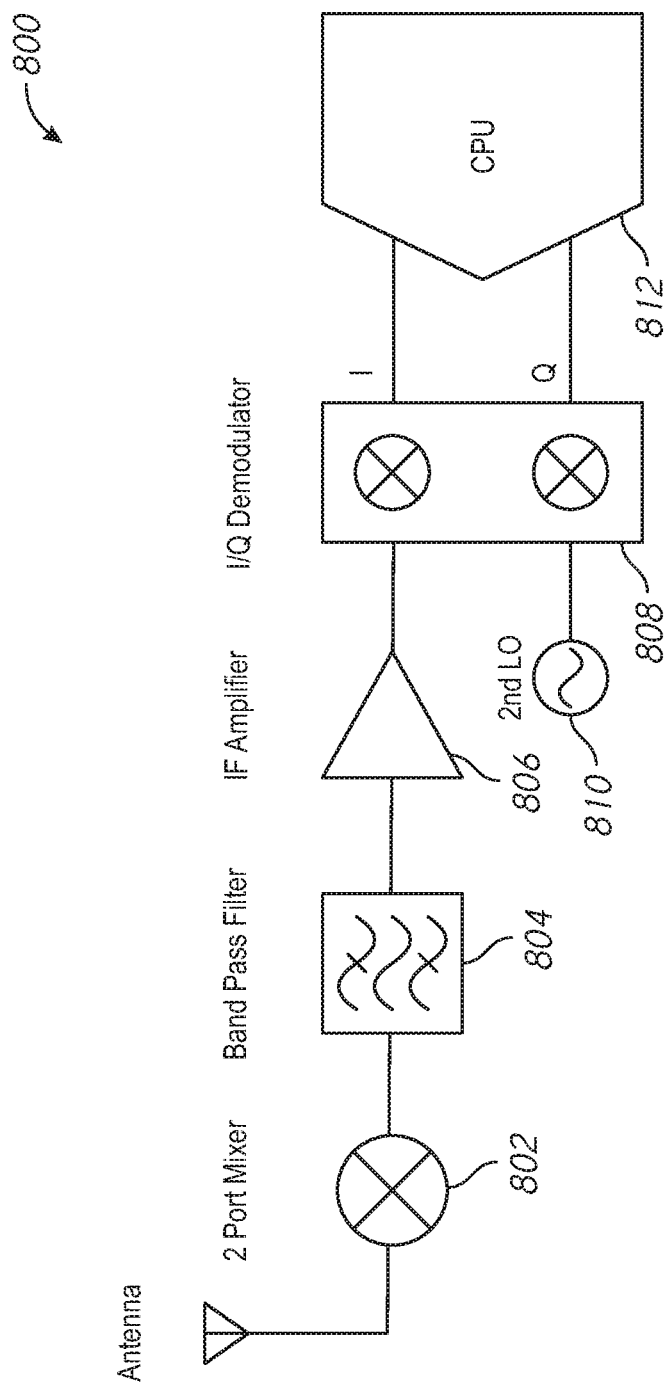
FIG. 8 is a schematic illustration of a receiver arranged in accordance with examples described herein.

FIG. 8 is a schematic illustration of a receiver arranged in accordance with examples described herein. The receiver 800 may be used to implement and/or may be implemented by, wholly or partially, the receiver 106 of FIG. 1. The receiver 800 includes two-port mixer 802, bandpass filter 804, IF amplifier 806, I/Q demodulator 808, local oscillator signal 810, and processing unit 812.

The two-port mixer 802 may be coupled to an antenna and may receive at an input port a wireless communication signal and carrier signal incident on the antenna. The two-port mixer 802 may be used to implement and/or implemented by the two-port mixer 108 of FIG. 1, two-port mixer 206 of FIG. 2, two-port mixer 300 of FIG. 3, and/or two-port mixer 400 of FIG. 4, for example. An output of the two-port mixer 802 may be coupled to bandpass filter 804, which may be implemented by and/or used to implement any bandpass filter described herein. The bandpass filter 804 may provide an intermediate frequency signal to the IF amplifier 806. The IF amplifier 806 may amplify the intermediate frequency signal and provide the amplified intermediate frequency signal to the I/Q demodulator 808.

The I/Q demodulator 808 utilizes a local oscillator signal 810 to provide output I/Q signals to processing unit 812. The I/Q demodulator 808 may include two mixers which may operate in quadrature on the IF frequency to produce I/Q data which may then be digitized by analog-to-digital converters (e.g. by processing unit 812) and digitally processed (e.g. by processing unit 812) to demodulate the incoming data stream. This approach may have the advantage of being able to demodulate any incoming modulation type including ASK, PSK, FSK, QAM, OFDM, and spread spectrum including DSSS with or without CCK modulation. While a local oscillator is used in some examples, the LO (e.g. Local oscillator signal 810) may operate at the relatively low IF frequency rather than the relatively high RF frequency and may thus consume little power compared to direct I/Q demodulation at the wireless communication signal frequency.

For example, in the Bluetooth example discussed with respect to FIG. 7, the RF and LO frequencies may be in the 2.4 GHz band, with an e.g. 11 MHz IF offset. Then the bandpass filter 804, IF amplifier 806, local oscillator signal 810, and I/Q demodulator 808, may operate in the 11 MHz frequency range and will thus consume much less power.

It should be appreciated that any type of I/Q demodulator may be used to implement I/Q demodulator 808, such as one or more Gilbert cell multipliers, switching demodulators including H-bridge mixers, etc.

The processing unit 812 may be used to implement and/or may be implemented by the processing unit 116 in some examples.

Example Implementation

The two-port mixer design shown in FIG. 3 was simulated with the harmonic balance mode of AWR Microwave Office. Avago HSMS-286C Schottky diodes were selected for their high frequency, low power performance. To properly simulate the mixer circuitry, both the diode model and package model must be included. The final design uses a microstrip matching network for the RF+LO port, and a lumped element matching network for the IF port. The RF+LO matching is designed for a 50Ω system for convenient cabled benchtop testing and use with 50Ω antennas and was optimized for the target input LO power level of −20 dBm. A Rogers 4003C substrate was used to minimize losses in the microstrip matching network.

An Agilent N5222A vector network analyzer (VNA) was used to characterize the performance of the fabricated two-port mixer. The input return loss was measured with LO+RF port power of −20 dBm as provided by the VNA. Return loss better than 15 dB is observed at our desired frequency range in Bluetooth Low Energy (BLE) advertising channel 38 at 2426 MHz.

Figure 9:
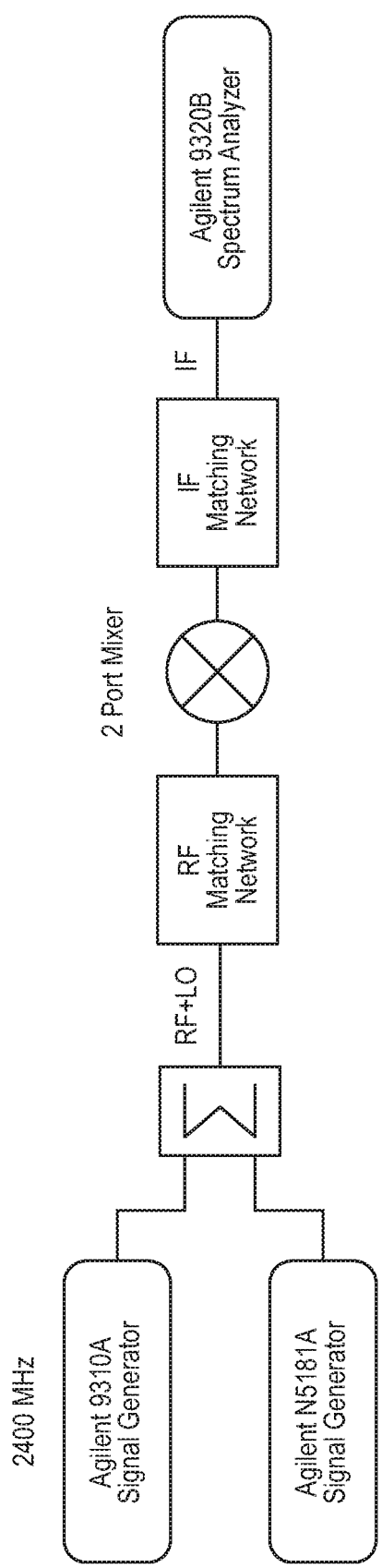
FIG. 9 is a schematic illustration of a cabled test setup for mixer conversion loss testing arranged in accordance with examples described herein.

The mixer conversion loss was measured with RF and LO input powers each of −20 dBm in the setup of FIG. 9. The reported mixer conversion loss is referenced to the RF input power. With an IF frequency of 10.9 MHz, where the conversion loss is at its minimum, the IF power at the spectrum analyzer is −47 dBm, for a reported conversion loss of 27 dB. A feature of the example two-port mixer design is that it provides optimum IF port matching from 9-11 MHz, providing significant rejection of higher frequency mixing products prior to the IF band pass filter (BPF).

To measure the conversion loss as a function of input power, the LO and RF sources were set to 2400 and 2411 MHz respectively, again using the setup of FIG. 9.

One challenge of using an external signal (e.g. a carrier signal) as an LO signal may be that LO power can vary over a wide dynamic range as the distance from the carrier source to the receiver device changes. Performance may accordingly depend on whether a relatively constant conversion loss is available from the mixer design, over the expected dynamic range of carrier signal power. The conversion loss of the example implemented mixer began to stabilize at between 26 dB and 27 dB as the carrier signal input power reaches the low-power design target of −20 dBm. By design, this LO power level (−20 dBm=10 μW) is similar to the minimum required RF power to operate state-of-the-art CMOS based RFID tags. Thus, in a wirelessly powered tag or sensor, if adequate carrier power is available to powerup the tag or sensor, there will be adequate LO power available for the mixer.

To test the optional DC output of the two-port mixer, a cabled test was performed using an LO-only input to the mixer, with a voltmeter measuring the harvested DC voltage at the optional DC output port. An Agilent N9310A signal generator producing a CW signal at 2400 MHz was used as the carrier source (e.g. LO source). The harvested voltage was measured for input power levels of −30 to 0 dBm, with an open circuit, 100 kΩ, and 10 kΩ loads. Depending on the voltage and power requirements of the tag or sensor, the optional DC output could be used to power the tag or sensor alone and/or in conjunction with another harvester or energy source.

Figure 10:
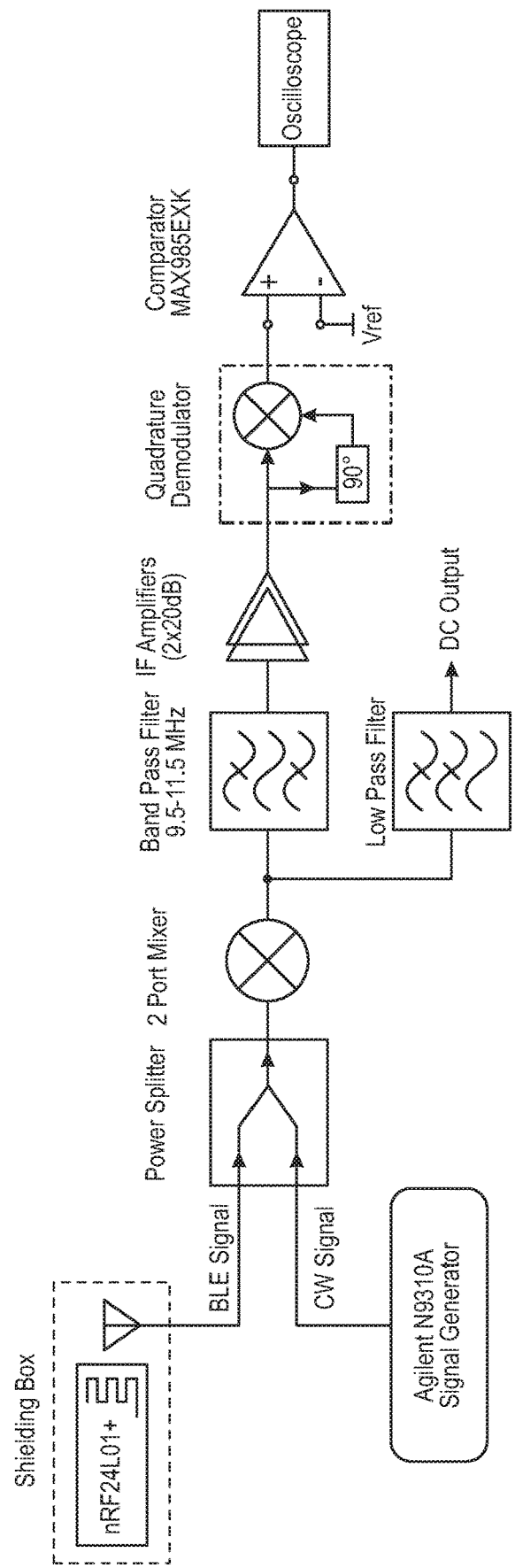
FIG. 10 is a schematic illustration of a cabled receiver test setup arranged in accordance with examples described herein.

Elements of the receiver architecture were validated in the cabled benchtop setup shown in FIG. 10. A Nordic Semiconductor nRF24LO1+ transceiver was used to generate a repeatable source of known Bluetooth Low Energy (BLE) transmissions in BLE advertising channel 38, which has a center frequency of 2426 MHz. The total duration of the BLE transmission is 232 μs and the transmissions are repeated every 140 ms. An LO signal (e.g. carrier signal) at 2415 MHz is provided by an Agilent N9310A signal generator and is continuously present. The LO signal and BLE signal are combined with a Mini-Circuits ZN2PD2-63-S+ power splitter/combiner and the combined LO+RF is then fed into the input port of the two-port mixer. In a practical receiver, the LO+RF signal combination would occur in the tag or sensor antenna.

The band pass filter shown in FIG. 10 is a three pole passive Butterworth band pass with cutoff frequencies of 9 and 13 MHz implemented with lumped element capacitors and inductors. Two IF amplifiers (Mini-Circuits ZFL-550+) were cascaded for a total IF gain of 40 dB. In an actual implementation, these amplifiers may be replaced with low power, high gain IF amplifiers.

The quadrature demodulator includes of a Mini-Circuits ZFY-1-S+ mixer and a lumped element phase shifter. The output of the quadrature demodulator is fed to the noninverting input of a MAX985EXK comparator which digitizes the output of the demodulator. This digital baseband stream is captured by an Agilent oscilloscope and saved to a USB stick as a .csv file for baseband processing in Matlab.

Two DC power supplies are used, one to power the IF amplifiers and another to power the MAX985EXK comparator. The two cables going into the power splitter are coming from the RF signal generator and the shielded box containing the Nordic Semiconductor nRF24LO1+ transceiver. The shielded box was used to prevent ingress of unwanted signals from nearby BLE-enabled smart phones transmitting on Ch. 38.

To validate the receiver and Matlab baseband processing, a known BLE advertising packet is repeatedly transmitted by the Nordic Semiconductor nRF24LO1+ BLE signal source. The packet used to test the low power receiver had a length of 232 bits. The preamble and access address are fixed for BLE advertisement messages. The payload data unit (PDU) contains information for the length of the total packet and also contains the device name. In this case "BLE-MBS!" was the device name used for testing.

To verify the "ground truth" of the known BLE packet, an Apple iPad mini and nRF51822 evaluation board were used. The Apple iPad mini showed packets with the desired device name "BLE-MBS!". The full packet information was also verified using the Wireshark packet sniffing tool and a Nordic Semiconductor nRF51822 evaluation board.

In the MATLAB baseband processing code, the start of the received packet was found using a correlation with the known 8 bit BLE preamble. The total length of the packet was determined by the length field in the BLE PDU. The total time analyzed was from 0 to 232 μs, the full length of the BLE advertisement packets used in this test. The first 8 bits of the packet are the preamble and the next 32 bits are the access address. Per the BLE specification, these 40 bits are always the same for BLE advertising packets. Once the preamble and access address are found by correlation with the preamble, the remaining bits are be grouped into bytes with the least significant bit first. Once the received data stream is grouped into bytes, both the preamble and access address are interpreted with the least significant byte first.

In the benchtop test setup, successful demodulation and decoding were obtained with a BLE signal input power of −8 dBm and an LO carrier input power of +3 dBm, referred to the LO+RF input of the two-port mixer. The need for such strong LO and RF signals is due to the conversion loss of the mixer combined with the low IF gain available from the two Mini-Circuits amplifiers, and such need may be reduced in other examples. For example, a lower IF may be used in other examples. The current frequency plan results in an IF centered at 11 MHz. The BLE signal of interest uses a GFSK modulation scheme with frequency deviation of ±250 kHz. A lower IF would result in a higher amplitude output from the quadrature demodulator due to an increasing ratio of frequency deviation to IF center frequency.

Alternatives to the zero-bias Schottky two-port mixer described here include a biased diode based mixer or a FET-based variable conductance mixer which could exhibit improved conversion loss in other examples.

From the foregoing it will be appreciated that, although specific embodiments of the invention have been described herein for purposes of illustration, various modifications may be made without deviating from the spirit and scope of the invention.

What is claimed is:

1. A system comprising:
a carrier source, the carrier source configured to provide a wireless carrier signal;
a wireless communication device, the wireless communication device separate from the carrier source, and the wireless communication device configured to provide a wireless communication signal containing data; and
a receiver including:
an antenna positioned to receive the wireless carrier signal and the wireless communication signal;
a two-port mixer, having one input port and one output port, coupled to the antenna at the input port, and configured to mix the wireless carrier signal and the wireless communication signal from the input port to provide an intermediate frequency signal at the output port; and
a demodulator configured to extract, at least in part, the data from the intermediate frequency signal.

2. The system of claim 1, wherein the wireless carrier signal comprises a continuous wave signal.

3. The system of claim 1, wherein the carrier source comprises a wireless access point or wireless router and wherein the wireless communication device comprises a smartphone.

4. The system of claim 1, wherein the two-port mixer comprises a diode configured to perform mixing.

5. The system of claim 1, further comprising a low-pass filter coupled to the two-port mixer and configured to provide a direct current (DC) signal.

6. The system of claim 5, wherein the direct current (DC) signal is used to provide at least a portion of operating power for the receiver.

7. The system of claim 1, wherein the receiver further comprises:
additional receiver circuitry configured to extract, at least in part, the data using a self-generated local oscillator signal; and
a processing unit coupled to the two-port mixer and the additional receiver circuitry, the processing unit configured to cause the receiver to extract the data using either the additional receiver circuitry or the two-port mixer based, at least in part, on a DC power level available to the receiver.

8. The system of claim 1, wherein the wireless carrier signal has a carrier frequency and the wireless communication signal has a communication frequency, and wherein the intermediate frequency signal comprises an intermediate frequency that is a mixing product of the carrier frequency and the communication frequency.

9. The system of claim 1, further comprising a plurality of wireless communication devices, each configured to provide a respective wireless communication signal encoding respective data; and wherein the demodulator is configured to extract, at least in part, the respective wireless communication signals using the intermediate frequency signal.

10. The system of claim 1, wherein the wireless carrier signal is used to provide at least a portion of operating power for the receiver.

11. The system of claim 1, wherein the wireless carrier signal is used as a local oscillator signal for the receiver.

12. A receiver comprising:
an antenna;
a two-port mixer coupled to the antenna, the two-port mixer configured to mix a carrier signal and a wireless communication signal incident on the antenna to provide an intermediate frequency signal, wherein the wireless communication signal includes data;
a demodulator configured to demodulate the intermediate frequency signal to, at least part, extract the data; and
a low-pass filter coupled to an output of the two-port mixer and configured to provide a DC signal.

13. The receiver of claim 12, wherein the receiver further comprises a backscatter modulator configured to transmit data using the antenna to backscatter the carrier signal, and wherein the backscatter modulator is configured to be powered, at least in part, by the DC signal.

14. The receiver of claim 13, further comprising a processing unit, wherein the processing unit is configured to receive the data, and wherein the processing unit is configured to provide transmission data to the backscatter modulator.

15. The receiver of claim 13, further comprising energy harvesting circuitry, and wherein the backscatter modulator is configured to be powered, at least in part, by the energy harvesting circuitry.

16. The receiver of claim 12, wherein the two-port mixer comprises a diode connected as a mixing element.

17. The receiver of claim 12, wherein the demodulator comprises an FM discriminator or an I/Q demodulator.

18. The receiver of claim 12, wherein the demodulator is powered at least in part by the DC signal.

19. The receiver of claim 12, wherein the receiver is powered at least in part by the carrier signal.

20. The receiver of claim 12, wherein the receiver is further configured to use the carrier signal as a local oscillator signal.

* * * * *